United States Patent
Choi et al.

(10) Patent No.: US 9,608,100 B2
(45) Date of Patent: Mar. 28, 2017

(54) HIGH ELECTRON MOBILITY TRANSISTOR AND METHOD OF MANUFACTURING THE SAME

(71) Applicant: Samsung Electronics Co., Ltd., Suwon-Si, Gyeonggi-Do (KR)

(72) Inventors: Hyuk-soon Choi, Hwaseong-si (KR); Jong-seob Kim, Hwaseong-si (KR); Jai-kwang Shin, Anyang-si (KR); Jae-joon Oh, Seongnam-si (KR); Jong-bong Ha, Yongin-si (KR); In-jun Hwang, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 241 days.

(21) Appl. No.: 13/714,957

(22) Filed: Dec. 14, 2012

(65) Prior Publication Data
US 2013/0234207 A1  Sep. 12, 2013

(30) Foreign Application Priority Data
Mar. 6, 2012  (KR) .................. 10-2012-0022879

(51) Int. Cl.
*H01L 29/417* (2006.01)
*H01L 29/778* (2006.01)
(Continued)

(52) U.S. Cl.
CPC ........ *H01L 29/778* (2013.01); *H01L 29/4175* (2013.01); *H01L 29/66431* (2013.01);
(Continued)

(58) Field of Classification Search
CPC .................................................. H01L 29/4175
See application file for complete search history.

(56) References Cited

U.S. PATENT DOCUMENTS 7,728,356 B2 *  6/2010  Suh ..................... H01L 29/1066
257/183
2009/0166677 A1 *  7/2009  Shibata ............. H01L 21/76251
257/192
(Continued)

FOREIGN PATENT DOCUMENTS

JP   2004319552 A   11/2004
JP   2006229218 A    8/2006
(Continued)

OTHER PUBLICATIONS

Office Action from corresponding Japanese Patent Publication 2013-043890, dated Oct. 24, 2016.

*Primary Examiner* — Raj R Gupta
(74) *Attorney, Agent, or Firm* — Harness, Dickey & Pierce, P.L.C.

(57) ABSTRACT

According to example embodiments, a high electron mobility transistor (HEMT) includes: stack including a buffer layer, a channel layer containing a two dimensional electron gas (2DEG) channel, and a channel supply layer sequentially stacked on each other, the stack defining a first hole and a second hole that are spaced apart from each other. A first electrode, a second electrode, and third electrode are spaced apart from each other along a first surface of the channel supply layer. A first pad is on the buffer layer and extends through the first hole of the stack to the first electrode. A second pad is on the buffer layer and extends through the second hole of the stack to the second electrode. A third pad is under the stack and electrically connected to the third electrode.

22 Claims, 16 Drawing Sheets

(51) Int. Cl.
*H01L 29/66* (2006.01)
*H01L 29/20* (2006.01)

(52) U.S. Cl.
CPC .... *H01L 29/66462* (2013.01); *H01L 29/7786* (2013.01); *H01L 29/2003* (2013.01)

(56) References Cited

U.S. PATENT DOCUMENTS

2009/0243083 A1* 10/2009 Han .................. H01L 23/49822
257/698
2011/0140172 A1* 6/2011 Chu .................... H01L 29/4175
257/194

FOREIGN PATENT DOCUMENTS

| JP | 2007142144 A | | 6/2007 |
|----|----|----|----|
| JP | 2009513014 A | | 3/2009 |
| JP | 2009076845 A | * | 4/2009 |
| JP | 2010192745 A | | 9/2010 |
| JP | 2011129924 A | | 6/2011 |
| KR | 100256695 B1 | | 5/2000 |

* cited by examiner

HIGH ELECTRON MOBILITY TRANSISTOR AND METHOD OF MANUFACTURING THE SAME

CROSS-REFERENCE TO RELATED APPLICATIONS

This application claims priority under 35 U.S.C. 119 to Korean Patent Application No. 10-2012-0022879, filed on Mar. 6, 2012, in the Korean Intellectual Property Office, the disclosure of which is incorporated herein in its entirety by reference.

BACKGROUND

1. Field

Example embodiments relate to power devices, and more particularly, to high electron mobility transistors (HEMTs) and/or methods of manufacturing the same.

2. Description of the Related Art

A high electron mobility transistor (HEMT) is a kind of power device that includes a 2-dimensional electron gas (2DEG) that is used as a carrier in a channel layer. Since the 2DEG is used as the carrier, a mobility of the HEMT may be higher than that of a general transistor.

A HEMT may include a compound semiconductor having a wide band gap. Accordingly, a breakdown voltage of the HEMT may be higher than that of the general transistor.

The breakdown voltage of the HEMT may increase in proportion to a thickness of a compound semiconductor layer including a 2DEG, for example, a gallium nitride (GaN) layer. Accordingly, forming a thicker GaN layer may increase the breakdown voltage of the HEMT.

However, forming a thicker GaN layer may take a longer time than forming a thinner GaN layer, and thus, productivity of the HEMT may be decreased. Thus, a method of removing a silicon substrate may be used to increase the breakdown voltage of the HEMT.

SUMMARY

Example embodiments relate to high electron mobility transistors (HEMTs).

Example embodiments relate to methods of manufacturing HEMTs.

Additional aspects will be set forth in part in the description which follows and, in part, will be apparent from the description, or may be learned by practice of example embodiments.

According to example embodiments, a HEMT includes: a channel supply layer; a channel layer on the channel supply layer, the channel layer including a two dimensional electron gas (2DEG) channel; a source electrode, a drain electrode, and a gate electrode supporting the channel supply layer; a source contact pad connected to the source electrode; a drain contact pad connected to the drain electrode; a gate contact pad connected to the gate electrode; and a buffer layer on the channel layer, wherein a first one of the source contact pad, the drain contact pad, and the gate contact pad is on an upper surface of the buffer layer, a second one of the source contact pad, the drain contact pad, and the gate contact pad is on the upper surface of the buffer layer or below the channel supply layer, and the channel supply layer is on a third one of the source contact pad, the drain contact pad, and the gate contact pad.

The source contact pad and the gate contact pad may be on the upper surface of the buffer layer, and the drain contact pad may be below the channel supply layer.

The second one of the source contact pad, the drain contact pad, and the gate contact pad may be on the upper surface of the buffer layer. The first one of the source contact pad, the drain contact pad, the gate contact pad may be connected to a first one of the source electrode, the drain electrode, and the gate electrode by penetrating the buffer layer, the channel layer, and the channel supply layer. The second one of the source contact pad, the drain contact pad, the gate contact pad may be connected to a second one of the source electrode, the drain electrode, and the gate electrode by penetrating the buffer layer, the channel layer, and the channel supply layer.

The drain contact pad and the gate contact pad may be on the upper surface of the buffer layer, and the channel supply layer may be on the source contact pad.

The source contact pad may be connected to the source electrode through a source pad outside of the 2DEG channel. The drain contact pad may be connected to the drain electrode through a drain pad outside of the 2DEG channel. The gate contact pad may be connected to the gate electrode through a gate pad outside of the 2DEG channel.

A bonding metal layer may be bonded to a conductive carrier wafer. The third one of the source contact pad, the drain contact pad, and the gate contact pad may be connected to one of the source electrode, gate electrode, and drain electrode through the bonding metal layer. The conductive carrier wafer may include one of silicon, metal, aluminum nitride (AlN), and direct bonded copper (DBC). The bonding metal layer may include an alloy including at least one of Cu, Au, and Sn.

The source contact pad, the drain contact pad, and the gate contact pad may each independently be one of metal pads and doped silicon pads.

According to example embodiments, a method of manufacturing a HEMT includes: forming a buffer layer on a silicon substrate; forming a channel layer on the buffer layer, and forming a channel supply layer on the channel layer, the channel layer including a two dimensional electron gas (2DEG) channel; forming a source electrode, a drain electrode, and a gate electrode on the channel supply layer; forming a source contact pad connected to the source electrode; forming a drain contact pad connected to the drain electrode; and forming a gate contact pad connected to the gate electrode, wherein a first one of the source contact pad, the drain contact pad, and the gate contact pad is on a first surface of the buffer layer, a second one of the source contact pad, the drain contact pad, and the gate contact pad is on the first surface of the buffer layer or below the channel supply layer, and the channel supply layer is between the buffer layer and the third one of the source contact pad, the drain contact pad, and the gate contact pad.

The source contact pad and the gate contact pad may be on the first surface of the buffer layer, and the channel supply layer may be between the buffer layer and the drain contact pad.

The drain contact pad and the gate contact pad may be on the first surface of the buffer layer, and the channel supply layer may be between the buffer layer and the source contact pad.

The first one of the source contact pad, the drain contact pad, and the gate contact pad may be formed by a first process that includes: forming a first via hole that penetrates the buffer layer, the channel layer, and the channel supply layer and exposes an a first one of the source electrode, the gate electrode, and the drain electrode; and filling the first via hole with a conductive material.

The forming the source contact pad connected to the source electrode may include connecting the source electrode to the source contact pad through a source pad outside of the 2DEG channel. The forming the drain contact pad connected to the drain electrode may include connecting the drain electrode to the drain contact pad through a drain pad outside of the 2DEG channel. The forming the gate contact pad connected to the gate electrode may include connect the gate electrode to the gate contact pad through a gate pad outside of the 2DEG channel.

The third one of the source contact pad, the drain contact pad, and the gate contact pad may be formed by a second process that includes: forming a bonding metal layer that is connected to the third one of the source contact pad, the drain contact pad, and the gate contact pad; attaching a conductive carrier wafer to the bonding metal layer; and forming the third one of the source contact pad, the drain contact pad, and the gate contact pad on the conductive carrier wafer.

A HEMT according to example embodiments does not include a silicon substrate under a channel layer and thus may have a high breakdown voltage. In addition, the HEMT includes contact pads. One of the contact pads is provided on a first side of the HEMT and the others are provided on a second side of the HEMT. The first side is in the opposite direction to the second side and thus, an existing packaging process may be used. Accordingly, a packaging process of the HEMT may be simplified compared to an existing HEMT.

According to example embodiments, a high electron mobility transistor (HEMT) includes: a stack including a buffer layer, a channel layer containing a two-dimensional electrode gas (2DEG) channel, and a channel supply layer sequentially stacked on each other, the stack defining a first hole and a second hole that are spaced apart from each other and each extend through the buffer layer, the channel layer, and the channel supply layer; a first pad on the buffer layer and extending through the first hole of the stack to the first electrode; a second pad on the buffer layer and extending through the second hole of the stack to the second electrode; and a third pad under the stack and electrically connected to the third electrode.

A carrier wafer may be on the third pad. The carrier wafer may contain a conductive material. A passivation layer may be on the carrier wafer and define a third hole that exposes the third electrode. The passivation layer may be between the carrier wafer and at least one of the first electrode, the second electrode, and the channel supply layer. A metal layer may extend through the third hole to connect the carrier wafer and the third electrode.

The second electrode may be between the first electrode and the third electrode along the first surface of the channel supply layer. The first pad may extend vertically from the first electrode through the first hole of the stack and extend horizontally on the buffer layer. The second pad may extend vertically from the second electrode through the second hole of the stack and extend horizontally on the buffer layer. The first pad and the second pad may be spaced apart from each other on the buffer layer.

The third electrode may be between the first electrode and the second electrode along the first surface of the channel supply layer. The first pad may extend vertically from the first electrode through the first hole of the stack and extend horizontally on the buffer layer. The second pad may extend vertically from the second electrode through the second hole of the stack and extend horizontally on the buffer layer. The first pad and the second pad may be spaced apart from each other on the buffer layer.

BRIEF DESCRIPTION OF THE DRAWINGS

These and/or other aspects will become apparent and more readily appreciated from the following description of non-limiting embodiments, taken in conjunction with the accompanying drawings in which like reference characters refer to the same parts throughout the different views. The drawings are not necessarily to scale, emphasis instead being placed upon illustrating the principles of example embodiments.

DETAILED DESCRIPTION

Figure 1:
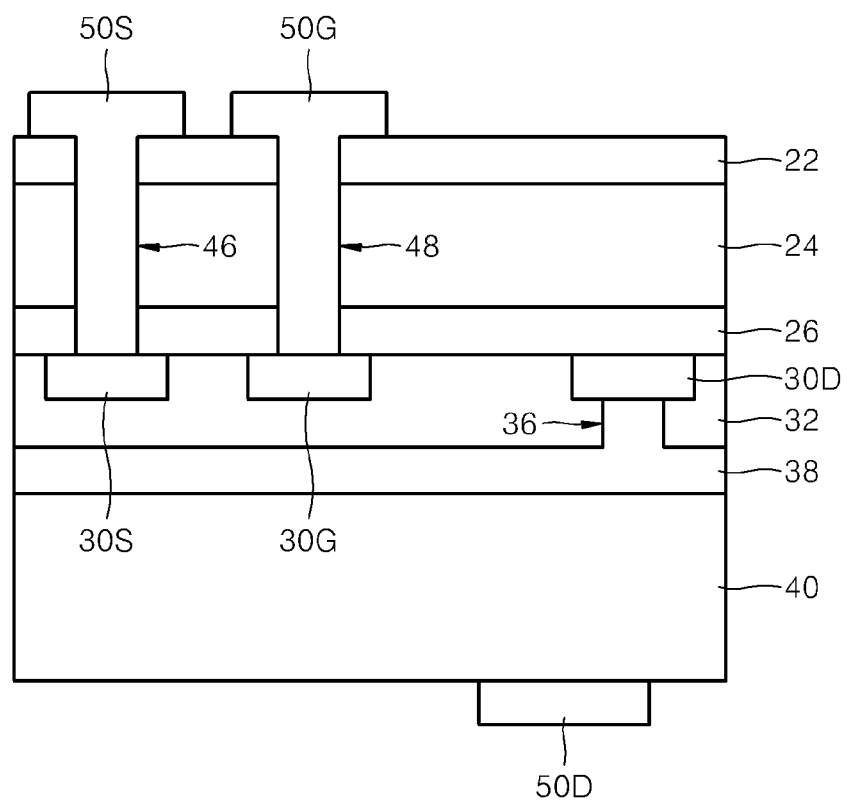
FIG. 1 is a cross-sectional view illustrating a high electron mobility transistor (HEMT) according to example embodiments.

Example embodiments will now be described more fully with reference to the accompanying drawings, in which some example embodiments are shown. Example embodiments, may, however, be embodied in many different forms and should not be construed as being limited to the embodiments set forth herein; rather, these example embodiments are provided so that this disclosure will be thorough and complete, and will fully convey the scope of example embodiments of inventive concepts to those of ordinary skill in the art. In the drawings, the thicknesses of layers and regions are exaggerated for clarity. Like reference numerals in the drawings denote like elements, and thus their description may be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof. Expressions such as "at least one of," when preceding a list of elements, modify the entire list of elements and do not modify the individual elements of the list.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a cross-sectional view illustrating a high electron mobility transistor (HEMT) according to example embodiments.

Figure 3:
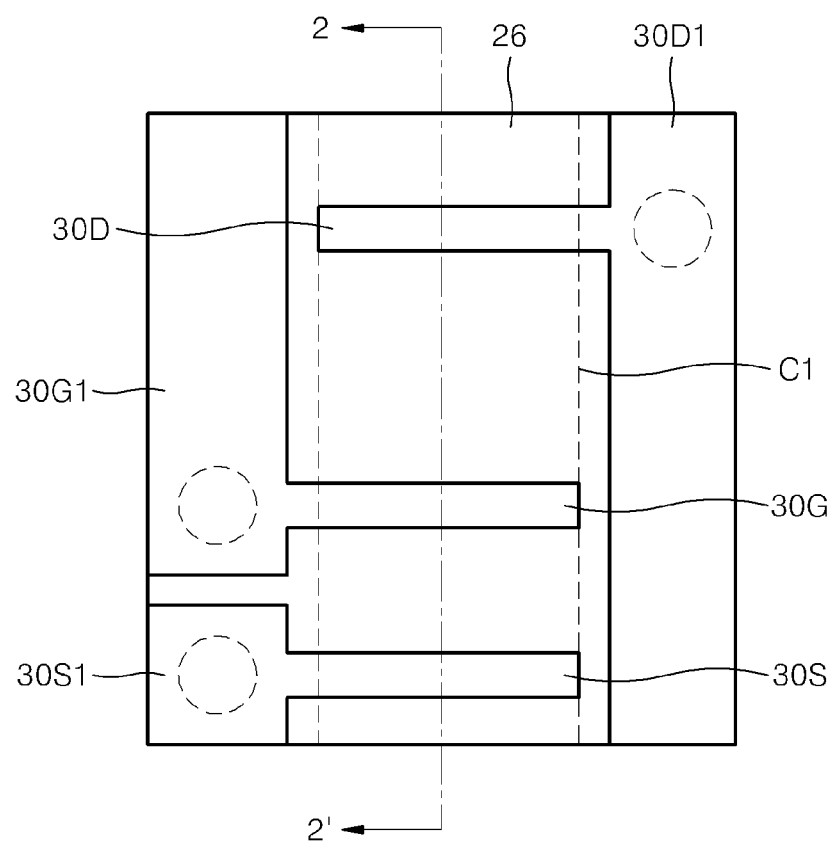

Referring to FIG. 1, a channel supply layer 26, a channel layer 24, and a buffer layer 22 are sequentially stacked. A source electrode 30S, a gate electrode 30G, and a drain electrode 30D are disposed on a bottom surface of the channel supply layer 26. The source electrode 30S is located closer to the gate electrode 30G, compared to the drain electrode 30D. The source electrode 30S, the gate electrode 30G, and the drain electrode 30D are covered with (and/or supported by) a passivation layer 32. A first via hole 36 through which the drain electrode 30D is exposed is formed in the passivation layer 32. A bonding metal layer 38 filling the first via hole 36 is disposed on a bottom surface of the passivation layer 32. A carrier wafer 40 is bonded to a bottom surface of the bonding metal layer 38. The carrier wafer 40 has relatively high electrical conductance. A drain contact pad 50D is disposed on a bottom surface of the carrier wafer 40. Second and third via holes 46 and 48 are formed in a stack formed of the channel supply layer 26, the channel layer 24, and the buffer layer 22. The source electrode 30S is exposed through the second via hole 46. The gate electrode 30G is exposed through the third via hole 48. A source contact pad 50S and a gate contact pad 50G are disposed on the buffer layer 22. The source contact pad 50S fills the second via hole 46 and is connected to the source electrode 30S. The gate contact pad 50G fills the third via hole 48 and is connected to the gate electrode 30G. In the above description, for convenience, a case where the source contact pad 50S and the gate contact pad 50G are connected to the source electrode 30S and the gate electrode 30G, respectively, has been described, and FIG. 1 illustrates the case. However, substantially, referring to FIG. 3, the source electrode 30S and the gate electrode 30G are connected to a source pad 30S1 and a gate pad 30G1 of FIG. 3, respectively. Accordingly, the source pad 30S1 of FIG. 3 is exposed through the second via hole 46, and the source contact pad 50S is connected to the source pad 30S1. The gate pad 30G1 of FIG. 3 is exposed through the third via hole 48, and the gate contact pad 50G is connected to the gate pad 30G1. In addition, a drain pad 30D1 of FIG. 3 is exposed through the first via hole 36, and the bonding metal layer 38 is connected to the drain pad 30D1 of FIG. 3 through the first via hole 36. Materials of the elements mentioned above will be described in a method of manufacturing the HEMT below.

A method of manufacturing an HEMT according to example embodiments will be described with reference to FIGS. 2 through 14.

Figure 2:
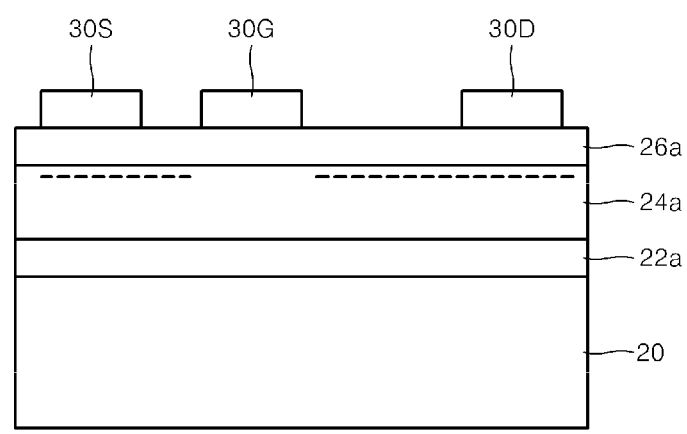
FIGS. 2 through 14 are cross-sectional views sequentially illustrating a method of manufacturing an HEMT, according to example embodiments.

Referring to FIG. 2, a buffer layer 22a is formed on a substrate 20. The substrate 20 may be a silicon substrate. The buffer layer 22a may be a nitride layer containing B, Al, Ga, or In. Also, the buffer layer 22a may be a layer structure including a plurality of nitride layers sequentially stacked. Each of the plurality of nitride layers contains B, Al, Ga, or In. A channel layer 24a is formed on the buffer layer 22a. The channel layer 24a may be formed by using an epitaxy method. The buffer layer 22a reduces a physical characteristic difference between the substrate 20 and the channel layer 24a. For example, a thermal expansion coefficient difference between the substrate 20 and the channel layer 24a may be alleviated by the buffer layer 22a. In addition, the buffer layer 22a may be used as a seed layer of the channel layer 24a. The channel layer 24a may be formed of a III-V group compound layer, for example, a GaN layer. A channel supply layer 26a is formed on the channel layer 24a. The channel supply layer 26a may be formed by using an epitaxy method. The band gap and polarization of the channel supply layer 26a may be larger than those of the channel layer 24a. Due to the band gap and polarization differences between the channel supply layer 26a and the channel layer 24a, a two dimensional electron gas (2DEG) (refer to the dotted line of FIG. 2) is generated in the channel layer 24a. The 2DEG may be used as a channel carrier. The 2DEG may exist under the interface between the channel layer 24a and the channel supply layer 26a. The channel supply layer 26a may be formed of a III-V group compound layer. For example, the channel supply layer 26a may be formed by depositing a nitride of B, Al, Ga, or In or a by depositing a nitride including a mixture of at least one of B, Al, Ga, and In. For example, the channel supply layer 26a may contain one of AlGaN, AlInN, InGaN, and AlInGaN, but example embodiments are not limited thereto. A source electrode 30S, a gate electrode 30G, and a drain electrode 30D are formed on the channel supply layer 26a. An interval between the source electrode 30S and the gate electrode 30G may be narrower than that between the drain electrode 30D and the gate electrode 30G.

Alternatively, the channel supply layer 26a in FIG. 2 may be AlGaAs and the channel layer 24a may be GaAs. However, example embodiments are not limited thereto.

FIG. 3 is a plan view of the HEMT illustrated in FIG. 2.

Referring to FIG. 3, the source electrode 30S is connected to a source pad 30S1. The source pad 30S1 may be formed of the same material as the source electrode 30S, and is formed together with the source electrode 30S. The gate electrode 30G is connected to a gate pad 30G1. The gate pad 30G1 may be formed of the same material as the gate electrode 30G, and may be formed together with the gate electrode 30G. The drain electrode 30D is connected to a drain pad 30D1. The drain pad 30D1 may be formed of the same material as the drain electrode 30D, and is formed together with the drain electrode 30D. The source pad 30S1, the gate pad 30G1, and the drain pad 30D1 are formed outside a 2DEG channel C1 between the source electrode 30S and the drain electrode 30D. Accordingly, in a following process, a contact for the source electrode 30S, a contact for the drain electrode 30D, and a contact for the gate electrode 30G are formed with respect to the source pad 30S1, the drain pad 30D1, and the gate pad 30G1, respectively. Dotted circles drawn on the source pad 30S1, drain pad 30D1, and gate pad 30G1 indicate examples of contact regions. FIG. 2 shows a cross-sectional view taken along a line 2-2' of FIG. 3.

Figure 4:
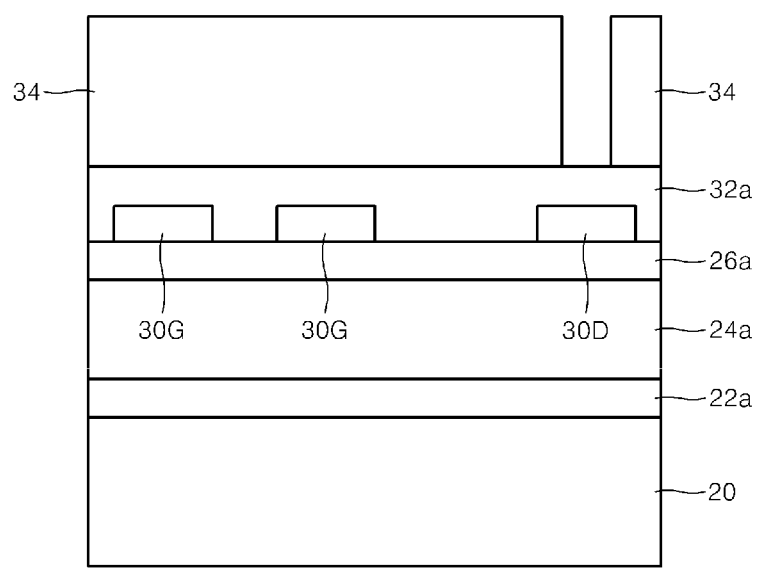

Next, referring to FIG. 4, a passivation layer 32a is formed on the channel supply layer 26a. The passivation layer 32a may be a dielectric material, for example, a silicon oxide layer; however, example embodiments are not limited thereto. A first mask 34 is formed on the passivation layer 32a. The first mask 34 may be a photoresist film pattern. The first mask 34 may be formed to expose a portion of the passivation layer 32a. The exposed portion of the passivation layer 32a may be a portion formed above the drain pad 30D1.

In the following description of FIG. 4 and other drawings, contacts are described by regarding the source electrode 30S, the gate electrode 30G, and the drain electrode 30D as the source pad 30S1, the gate pad 30G1, and the drain pad 30D1, respectively. For example, an expression "a contact by which the drain electrode 30D is exposed is formed" means that a contact by which the drain pad 30D1 is exposed is formed.

Figure 5:
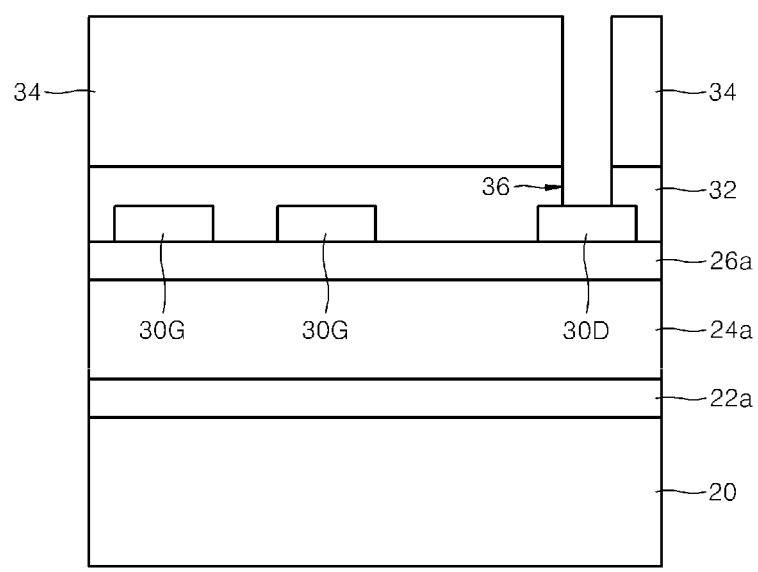

Referring to FIG. 4 again, the exposed portion of the passivation layer 32a is etched. This etching may be performed by using a dry etching. The etching is performed until the drain electrode 30D is exposed. Due to the etching, as illustrated in FIG. 5, the first via hole 36 through which the drain electrode 30D is exposed is formed in the passivation layer 32.

The first mask 34 is removed after the etching.

Figure 6:
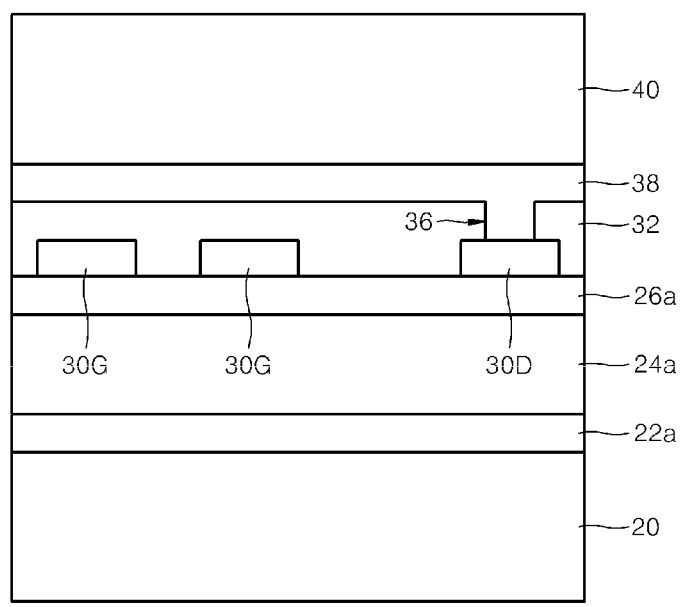

Next, referring to FIG. 6, a bonding metal layer 38 that fills the first via hole 36 is formed on the passivation layer 32. The bonding metal layer 38 contacts the drain electrode 30D. The bonding metal layer 38 may be formed of, for example, an alloy including at least one of Cu, Au, and Sn. A carrier wafer 40 is bonded to the bonding metal layer 38. The carrier wafer 40 is bonded to a stack under the bonding metal layer 38 through the bonding metal layer 38. The carrier wafer 40 may be a conductive wafer having relatively high conductivity. For example, the carrier wafer 40 may be formed of silicon, metal, aluminum nitride (AlN), or direct bonded copper (DBC), but example embodiments are not limited thereto. If the carrier wafer 40 is formed of silicon, the silicon may be doped with impurities to increase an electrical conductivity of the carrier wafer 40.

Figure 7:
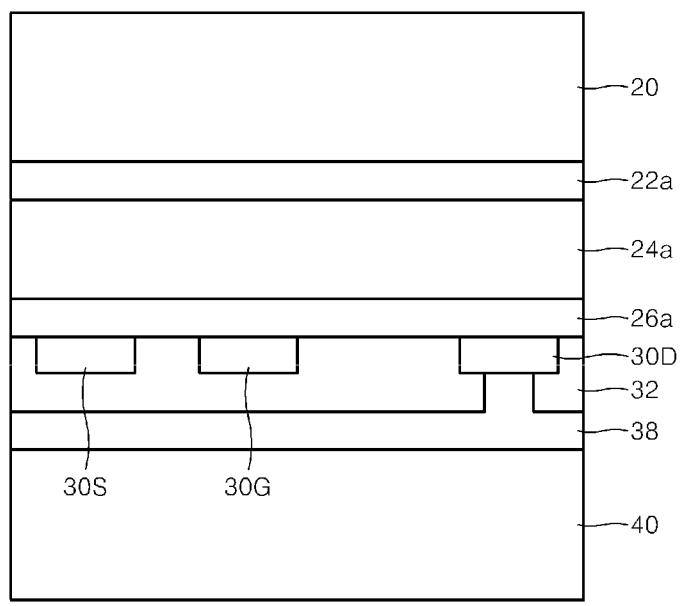

Next, as illustrated in FIG. 7, the structure of FIG. 6 is turned over to locate the substrate 20 on the top and locate the carrier wafer 40 on the bottom.

Figure 8:
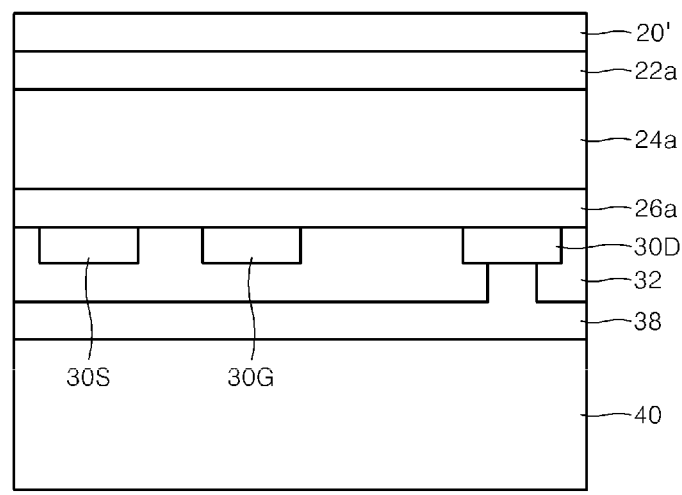

Referring to FIG. 7, a portion of the substrate 20 is removed by polishing until the substrate 20 has a desired (and/or predetermined) thickness. Such polishing may be performed, for example, by using a chemical mechanical polishing method. According to the polishing, the thickness is reduced to form a thinner substrate 20', as illustrated in FIG. 8.

Figure 9:
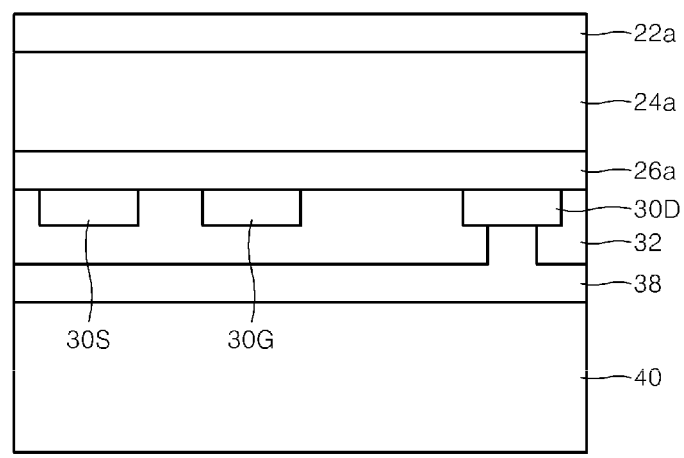

The substrate 20' having a smaller thickness after polishing may be removed by using an etching method, for example, a wet etching method using a silicon etchant. FIG. 9 shows a result after the substrate 20' on the buffer layer 22 has been substantially (and/or completely) removed.

Figure 10:
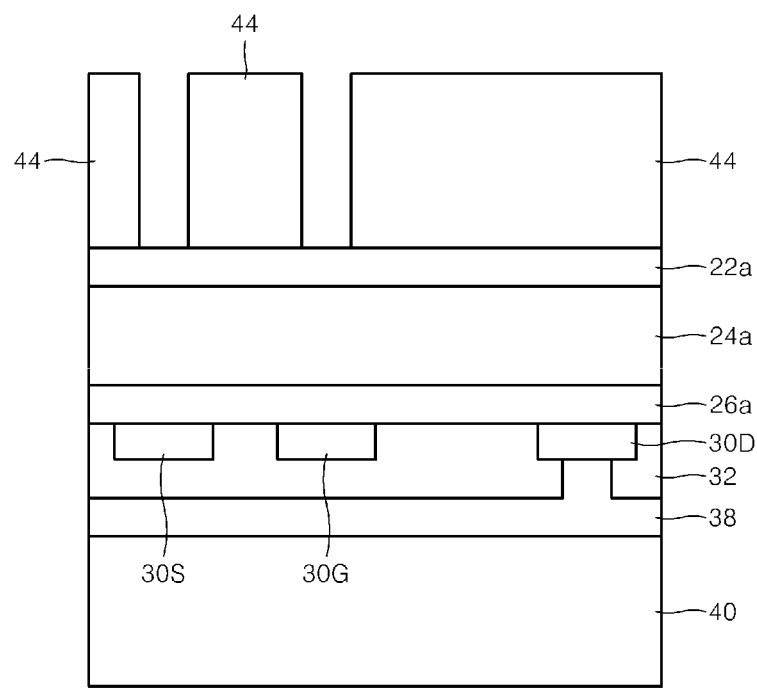
Figure 11:
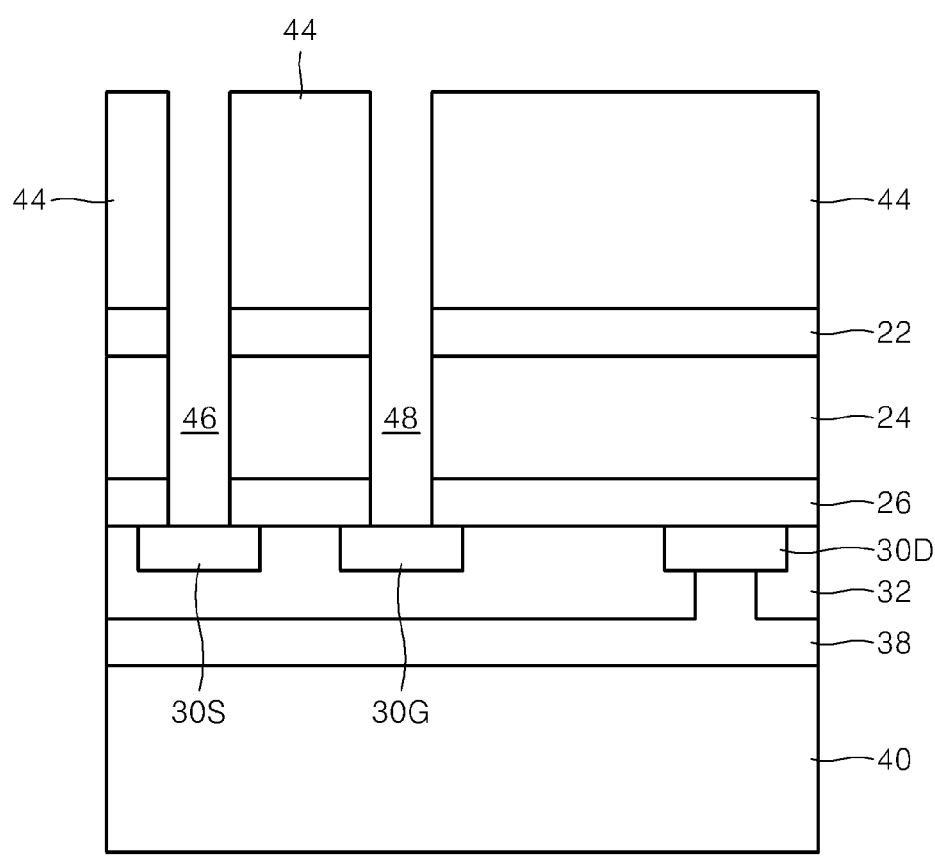
Figure 12:
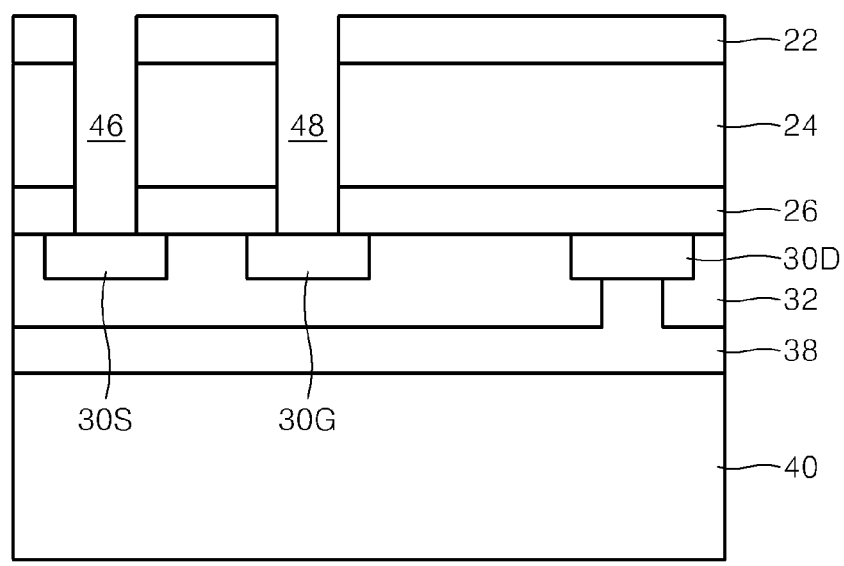

Referring to FIG. 10, a second mask 44 is formed on the buffer layer 22a. The second mask 44 may be a photoresist pattern. The second mask 44 is formed to expose a portion of the buffer layer 22a. The exposed portion of the buffer layer 22a may be a portion formed above the source electrode 30S and a portion formed above the gate electrode 30G. As stated above, the source electrode 30S and the gate electrode 30G indicate the source pad 30S1 and the gate pad 30G1 of FIG. 3, respectively. Accordingly, the exposed portion of the buffer layer 22a may be a portion formed above the source pad 30S1 of FIG. 3 and a portion formed above the gate pad 30G1. After forming the second mask 44, the exposed portion of the buffer layer 22a is etched. In this case, the etching may be performed until the source electrode 30S and the gate electrode 30G are exposed. Due to the etching, as illustrated in FIG. 11, a second via hole 46 through which the source electrode 30S is exposed and a third via hole 48 through which the gate electrode 30G is exposed are formed in the stack including the channel supply layer 26, the channel layer 24, and the buffer layer 22. The second and third via holes 46 and 48 are spaced apart from each other. After forming the second and third via holes 46 and 48, the second mask 44 is removed. FIG. 12 shows a resultant structure after the second mask 44 has been removed.

Figure 13:
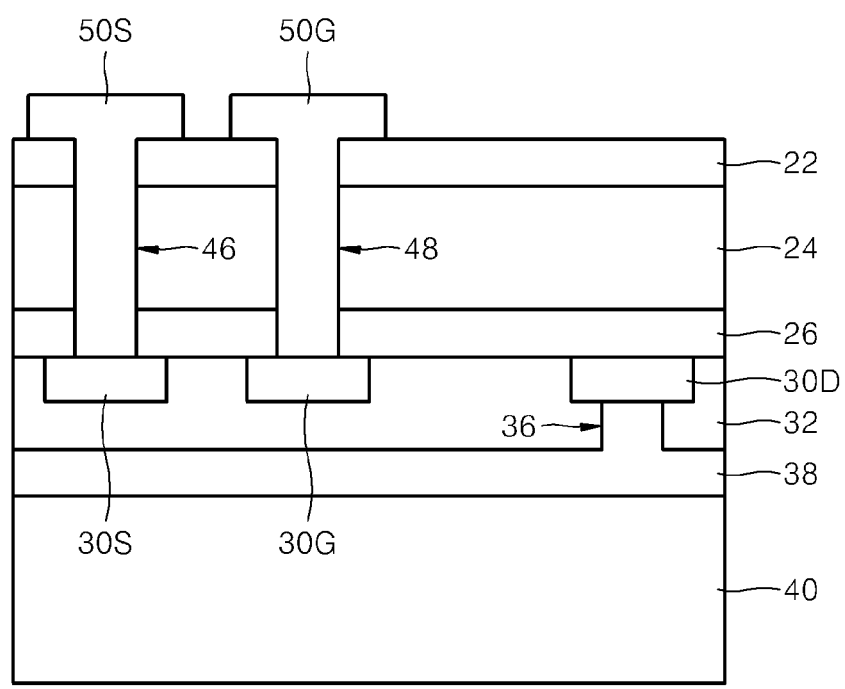

Next, referring to FIG. 13, a source contact pad 50S and a gate contact pad 50G are formed on the buffer layer 22. The source contact pad 50S fills the second via hole 46 and is connected to the source electrode 30S. The gate contact pad 50G fills the third via hole 48 and is connected to the gate electrode 30G. Also, in this case, the source electrode 30S and the gate electrode 30G are connected to the source pad 30S1 and the gate pad 30G1 of FIG. 3. Accordingly, the source contact pad 50S may be connected to a portion (a dotted circle region of FIG. 3) of the source pad 30S1, and the gate contact pad 50G may be connected to a portion (a dotted circle region of FIG. 3) of the gate pad 30G1. The source contact pad 50S and the gate contact pad 50G may be connected to an external power supply (not shown). The source contact pad 50S, the drain contact pad 50D, and the gate contact pad 50G may independently be metal pads or highly doped silicon pads. For example, if one or more of the source contact pad 50S, the drain contact pad 50D, and the gate contact pad 50G are highly doped silicon pads, then the highly doped silicon pads may be doped with an n-type dopant such as phosphorus (P) or a p-type dopant such as boron (B) or aluminum (Al). The doping concentration of the n-type or p-type dopant may be about $10^{19}/cm^3$ to about $10^{21}/cm^3$. However, example embodiments are not limited thereto.

Figure 14:
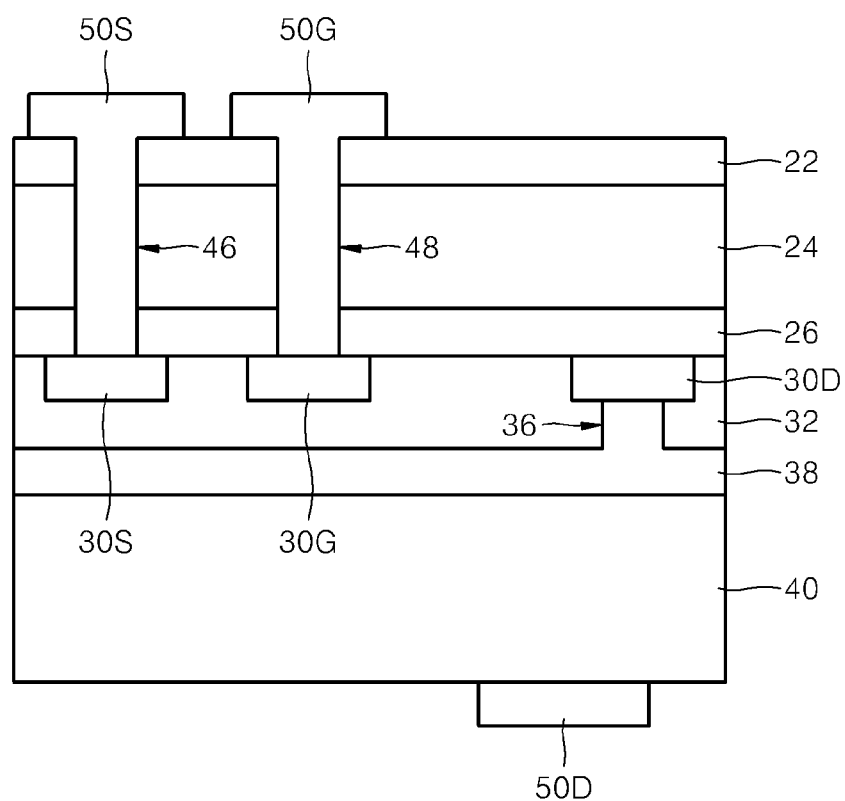

Next, as illustrated in FIG. 14, a drain contact pad 50D is formed on a bottom surface of the carrier wafer 40 having conductivity. In this manner, by separately disposing contact pads on top and bottom surfaces of the HEMT, an existing packaging process may be used. Accordingly, a power device according to example embodiments may raise a breakdown voltage by removing a silicon substrate and use an existing packaging process, and thus may be easily packaged.

Figure 15:
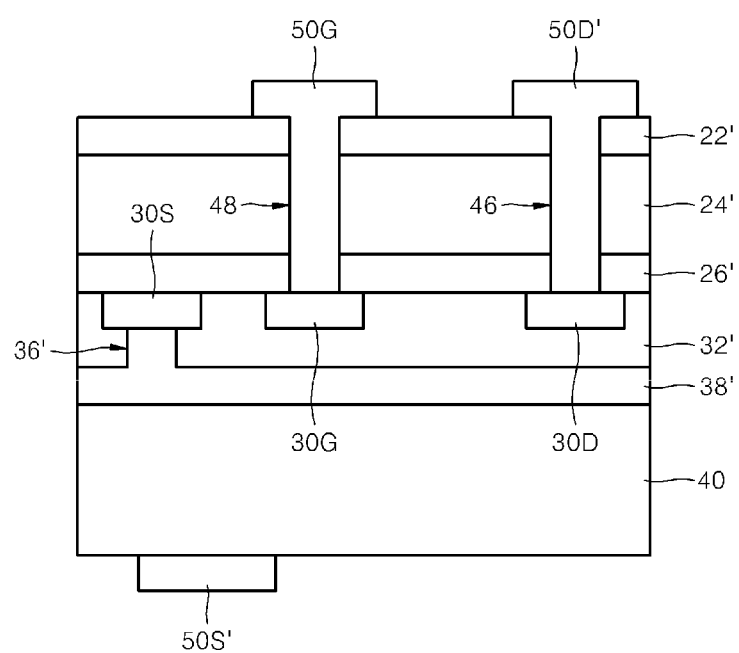
FIG. 15 is a cross-sectional view illustrating a high electron mobility transistor (HEMT) according to example embodiments.

Although, in the above description, the source contact pad 50S and the gate contact pad 50G have been formed in the same direction through the channel supply layer 26, channel layer 24, and buffer layer 22, example embodiments are not limited thereto. For example, FIG. 15 is a cross-sectional view illustrating a high electron mobility transistor (HEMT) according to example embodiments. As illustrated in FIG. 15, the gate contact pad 50G and the drain contact pad 50D' may be formed in the same direction through the channel supply layer 26', channel layer 24', and buffer layer 22', and the source contact pad 50S' may be formed in a different direction under the carrier wafer 40. The source contact pad 50S' may be connected to the source electrode 30S through a bonding metal layer 38' that extends through a first via hole 36' defined in the passivation layer 32'.

Figure 16:
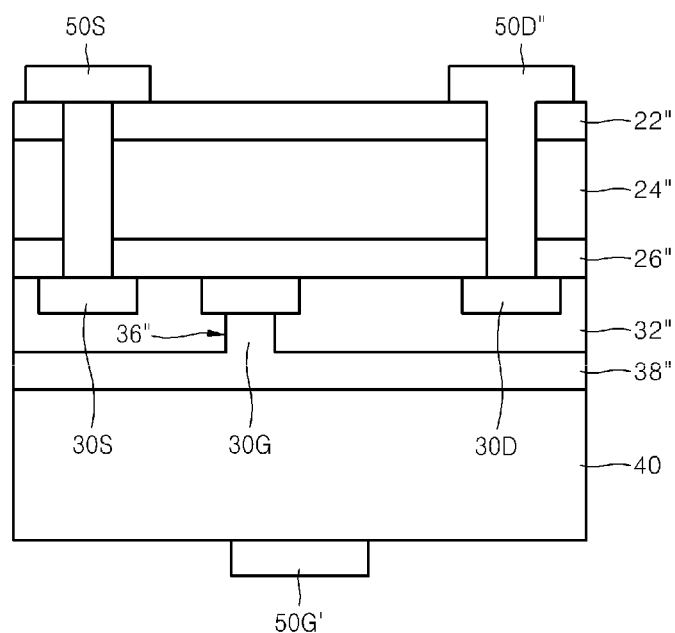
FIG. 16 is a cross-sectional view illustrating a high electron mobility transistor (HEMT) according to example embodiments.

Alternatively, only the gate contact pad 50G may be formed in a different direction. FIG. 16 is a cross-sectional view illustrating a high electron mobility transistor (HEMT) according to example embodiments. As illustrated in FIG. 16, the gate contact pad 50G' contacts carrier wafer 40, and the drain contact pad 50D may be formed through the channel supply layer 26", channel layer 24", and buffer layer 22". The gate contact pad 50G' may be connected to the gate electrode 30G through a bonding metal layer 38" that extends through a first via hole 36" defined in the passivation layer 32".

The materials for the drain contact pads 50D' and 50D", the buffer layer 22' and 22", channel layer 24' and 24", channel supply layer 26' and 26", passivation layer 32' and 32", metal bonding layer 26' and 26", source contact pad 50S' and gate contact pad 50G' illustrated in FIGS. 15-16 may be the same as the drain contact pad 50D, buffer layer 22, channel layer 24, channel supply 26, passivation layer 32, metal bonding layer 26, source contact pad 50S, and gate contact pad 50G described above with respect to FIG. 1.

In addition, in the process of forming the bonding metal layer 38, the bonding metal layer 38 may be formed only in a portion of the passivation layer 32.

While some example embodiments have been particularly shown and described, it will be understood by one of ordinary skill in the art that variations in form and detail may be made therein without departing from the spirit and scope of the claims.

What is claimed is:

1. A high electron mobility transistor (HEMT) comprising:
   a channel supply layer;
   a channel layer on the channel supply layer,
      the channel layer including a two dimensional electron gas (2DEG) channel;
   a source electrode, a drain electrode, and a gate electrode spaced apart from each other and supporting the channel supply layer;
   a source contact pad connected to the source electrode;
   a drain contact pad connected to the drain electrode;
   a gate contact pad connected to the gate electrode; and
   a buffer layer on the channel layer,
      the buffer layer, the channel layer, and the channel supply layer defining a first via hole and a second via hole, respectively, that are spaced apart from each other and expose two of the source electrode, the drain electrode, and the gate electrode, respectively,
      a first one of the source contact pad, the drain contact pad, and the gate contact pad is on an upper surface of the buffer layer and fills the first via hole,
      a second one of the source contact pad, the drain contact pad, and the gate contact pad is on the upper surface of the buffer layer and fills the second via hole,
   the first via hole and the second via hole each having widths that are less than respective widths of the two of the source electrode, the drain electrode, and the gate electrode, and less than respective widths of uppermost portions of the first one and the second one of the source contact pad, the drain contact pad, and the gate contact pad, and
   the channel supply layer is on a third one of the source contact pad, the drain contact pad, and the gate contact pad.

2. The HEMT of claim 1, wherein
the source contact pad and the gate contact pad are on the upper surface of the buffer layer, and
the drain contact pad is below the channel supply layer.

3. The HEMT of claim 1, wherein
the channel supply layer is between the gate electrode and the channel layer,
the first one of the source contact pad, the drain contact pad, and the gate contact pad is connected to a first one of source electrode, the drain electrode, and the gate electrode by penetrating the buffer layer, the channel layer, and the channel supply layer through the first via hole, and
the second one of the source contact pad, the drain contact pad, and the gate contact pad is connected to a second one of source electrode, the drain electrode, and the gate electrode by penetrating the buffer layer, the channel layer, and the channel supply layer through the second via hole.

4. The HEMT of claim 1, wherein
the drain contact pad and the gate contact pad are on the upper surface of the buffer layer, and
the channel supply layer is on the source contact pad.

5. The HEMT of claim 1, wherein
the source contact pad is connected to the source electrode through a source pad outside of the 2DEG channel,
the drain contact pad is connected to the drain electrode through a drain pad outside of the 2DEG channel, and
the gate contact pad is connected to the gate electrode through a gate pad outside of the 2DEG channel.

6. The HEMT of claim 1, further comprising:
a conductive carrier wafer;
a passivation layer on the conductive carrier wafer;
a bonding metal layer bonded to the conductive carrier wafer, wherein
the passivation layer defines a third via hole,
the third one of the source contact pad, the drain contact pad, and the gate contact pad is connected to one of the source electrode, gate electrode, and drain electrode through the bonding metal layer,
a width of the third via hole is less than a width of the third one of the source contact pad, the drain contact pad, and the gate contact pad, and
the width of the third via hole is less than a width of corresponding one of the source electrode, the gate electrode, and the drain electrode that is adjacent to the third via hole.

7. The HEMT of claim 6, wherein the conductive carrier wafer includes one of silicon, metal, aluminum nitride (AlN), and direct bonded copper (DBC).

8. The HEMT of claim 6, wherein the bonding metal layer contains an alloy including at least one of Cu, Au, and Sn.

9. The HEMT of claim 1, wherein the source contact pad, the drain contact pad, and the gate contact pad are each independently one of metal pads and doped silicon pads.

10. A method of manufacturing a high electron mobility transistor (HEMT), the method comprising:
forming a channel layer on a buffer layer;
forming a channel supply layer on the channel layer, the channel layer including a two dimensional electron gas (2DEG) channel;
forming a source electrode, a drain electrode, and a gate electrode on the channel supply layer and spaced apart from each other;
forming a first via hole and a second via hole, respectively, that are defined by the buffer layer, the channel layer, and the channel supply layer, spaced apart from each other, and expose two of the source electrode, the drain electrode, and the gate electrode, respectively;
forming a source contact pad connected to the source electrode;
forming a drain contact pad connected to the drain electrode; and
forming a gate contact pad connected to the gate electrode, wherein
a first one of the source contact pad, the drain contact pad, and the gate contact pad is on a first surface of the buffer layer and fills the first via hole, the first surface is an upper surface of the buffer layer,
a second one of the source contact pad, the drain contact pad, and the gate contact pad is on the first surface of the buffer layer and fills the second via hole,
the first via hole and the second via hole each having widths that are less than respective widths of the two of the source electrode, the drain electrode, and the gate electrode, and less than respective widths of uppermost portions of the first one and the second one of the source contact pad, the drain contact pad, and the gate contact pad,
the buffer layer is on the channel supply layer, and
the channel supply layer is on a third one of the source contact pad, the drain contact pad, and the gate contact pad.

11. The method of claim 10, wherein
the source contact pad and the gate contact pad are on the first surface of the butter layer, and
the channel supply layer is between the buffer layer and the drain contact pad.

12. The method of claim 10, wherein
the channel supply layer is between the gate electrode and the channel layer,
the drain contact pad and the gate contact pad are on the first surface of the buffer layer, and
the channel supply layer is between the buffer layer and the source contact pad.

13. The method of claim 10, wherein the first one of the source contact pad, the drain contact pad, and the gate contact pad is formed by a first process that includes:
forming the first via hole to penetrate the buffer layer, the channel layer, and the channel supply layer and expose a first one of the source electrode, the gate electrode, and the drain electrode; and
filling the first via hole with a conductive material.

14. The method of claim 10, wherein
the forming the source contact pad connected to the source electrode includes connecting the source electrode to the source contact pad through a source pad outside of the 2DEG channel,
the forming the drain contact pad connected to the drain electrode includes connecting the drain electrode to the drain contact pad through a drain pad outside of the 2DEG channel, and
the forming the gate contact pad connected to the gate electrode includes connecting the gate electrode to the gate contact pad through a gate pad outside of the 2DEG channel.

15. The method of claim 10, wherein the third one of the source contact pad, the drain contact pad, and the gate contact pad is formed by a second process that includes:
forming a bonding metal layer that is connected to connected to the third one of the source contact pad, the drain contact pad, and the gate contact pad;
attaching a conductive carrier wafer to the bonding metal layer; and
forming the third one of the source contact pad, the drain contact pad, and the gate contact pad on the conductive carrier wafer.

16. The method of claim 15, wherein the conductive carrier wafer includes one of silicon, metal, AlN, and DBC.

17. The method of claim 15, wherein the bonding metal layer contains an alloy including at least one of Cu, Au, and Sn.

18. The method of claim 10, wherein the source contact pad, the drain contact pad, and the gate contact pad are each independently one of metal pads and doped silicon pads.

19. A high electron mobility transistor (HEMT) comprising:
a stack including a buffer layer, a channel layer containing a two-dimensional electron gas (2DEG) channel, and a channel supply layer sequentially stacked on each other,
the stack defining a first hole and a second hole that are spaced apart from each other and each extend through the buffer layer, the channel layer, and the channel supply layer, the first hole and the second hole having a first width and a second width respectively;
a first electrode, a second electrode, and a third electrode spaced apart from each other along a first surface of the channel supply layer,
the first hole exposing the first electrode and the second hole exposing the second electrode,
a width of the first electrode is greater than the first width of the first hole, and a width of the second electrode is greater than the second width of the second hole;

a first pad on the buffer layer and extending through the first hole of the stack to the first electrode, the first pad having a width at an uppermost portion that is greater than the first width of the first hole;

a second pad on the buffer layer and extending through the second hole of the stack to the second electrode, the second pad having a width at an uppermost portion that is greater than the second width of the second hole; and a third pad under the stack and electrically connected to the third electrode.

20. The HEMT of claim 19, further comprising:

a carrier wafer on the third pad,
   the carrier wafer containing a conductive material;

a passivation layer on the carrier wafer,
   the passivation layer defining a third hole that exposes the third electrode,
   the passivation layer between the carrier wafer and at least one of the first electrode, the second electrode, and the channel supply layer; and a metal layer that extends through the third hole to connect the carrier wafer and the third electrode, wherein a width of the third electrode is greater than a width of the third hole, the channel supply layer is between the channel layer and one of the first to third electrodes, and the one of the first to third electrodes is a gate electrode.

21. The HEMT of claim 19, wherein the second electrode is between the first electrode and the third electrode along the first surface of the channel supply layer, the first pad extends vertically from the first electrode through the first hole of the stack and extends horizontally on the buffer layer, the second pad extends vertically from the second electrode through the second hole of the stack and extends horizontally on the buffer layer, and the first pad and the second pad are spaced apart from each other on the buffer laycr.

22. The HEMT of claim 19, wherein the third electrode is between the first electrode and the second electrode along the first surface of the channel supply layer, the first pad extends vertically from the first electrode through the first hole of the stack and extends horizontally on the buffer layer, the second pad extends vertically from the second electrode through the second hole of the stack and extends horizontally on the buffer layer, and the first pad and the second pad are spaced apart from each other on the buffer.

* * * * *